US009431244B2

(12) United States Patent
Hong et al.

(10) Patent No.: US 9,431,244 B2
(45) Date of Patent: Aug. 30, 2016

(54) LASER ANNEALING TECHNIQUE FOR METAL OXIDE TFT

(71) Applicant: QUALCOMM MEMS Technologies, Inc., San Diego, CA (US)

(72) Inventors: John Hyunchul Hong, San Clemente, CA (US); Tze-Ching Fung, San Diego, CA (US); Cheonhong Kim, San Diego, CA (US); Kenji Nomura, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 14/495,586

(22) Filed: Sep. 24, 2014

(65) Prior Publication Data

US 2016/0086802 A1   Mar. 24, 2016

(51) Int. Cl.
    *H01L 21/8242*  (2006.01)
    *H01L 21/02*    (2006.01)
    *H01L 29/66*    (2006.01)
    *H01L 29/786*   (2006.01)

(52) U.S. Cl.
    CPC ... *H01L 21/02664* (2013.01); *H01L 21/02565* (2013.01); *H01L 29/66969* (2013.01); *H01L 29/78693* (2013.01)

(58) Field of Classification Search
    CPC ........... H01L 29/7869; H01L 27/3244; H01L 27/1225; H01L 51/5237; H01L 29/78693
    See application file for complete search history.

(56) References Cited

U.S. PATENT DOCUMENTS

| 6,632,749 B2 | 10/2003 | Miyasaka et al. |  |
|---|---|---|---|
| 2003/0230967 A1* | 12/2003 | Kawamura et al. | 313/483 |
| 2005/0005799 A1* | 1/2005 | Hirai | 101/483 |
| 2007/0072439 A1* | 3/2007 | Akimoto et al. | 438/795 |
| 2007/0176551 A1* | 8/2007 | Kwak | 313/512 |
| 2009/0159880 A1* | 6/2009 | Honda et al. | 257/43 |
| 2010/0123132 A1 | 5/2010 | Nakata et al. |  |
| 2011/0006297 A1* | 1/2011 | Inoue et al. | 257/43 |
| 2011/0062431 A1 | 3/2011 | Shieh et al. |  |
| 2011/0104851 A1 | 5/2011 | Akimoto et al. |  |
| 2012/0295397 A1 | 11/2012 | Koezuka et al. |  |

OTHER PUBLICATIONS

Solomon, PM., "Light Absorbing Layer," IBM, An IP.com Prior Art Database Technical Disclosure, Original Publication Date: Jun. 1, 1981, Original Disclosure Information: TDP 06-81 p. 732-733, IP.com Electronic Publication: Feb. 11, 2005, pp. 3.

(Continued)

*Primary Examiner* — Zandra Smith
*Assistant Examiner* — John M Parker
(74) *Attorney, Agent, or Firm* — Weaver Austin Villeneuve & Sampson LLP

(57) ABSTRACT

This disclosure provides methods and apparatuses for annealing an oxide semiconductor in a thin film transistor (TFT). In one aspect, the method includes providing a substrate with a partially fabricated TFT structure formed on the substrate. The partially fabricated TFT structure can include an oxide semiconductor layer and a dielectric oxide layer on the oxide semiconductor layer. The oxide semiconductor layer is annealed by heating the dielectric oxide layer with an infrared laser under ambient conditions to a temperature below the melting temperature of the oxide semiconductor layer. The infrared laser radiation can be substantially absorbed by the dielectric oxide layer and can remove unwanted defects from the oxide semiconductor layer at an interface in contact with the dielectric oxide layer.

21 Claims, 11 Drawing Sheets

(56) References Cited

OTHER PUBLICATIONS

Zan H-W., et al., "Low Temperature Annealing with Solid-State Laser or UV Lamp Irradiation on Amorphous IGZO Thin-Film Transistors", Electrochemical and Solid-State Letters, 2010, vol. 13, Issue 5, pp. H144-H146.

International Search Report and Written Opinion dated Nov. 30, 2015,—for International App. No. PCT/US2015/050006.

* cited by examiner

LASER ANNEALING TECHNIQUE FOR METAL OXIDE TFT

TECHNICAL FIELD

This disclosure relates to thin film transistors and more particularly to annealing metal oxide thin film transistors in electromechanical systems and devices.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term IMOD or interferometric light modulator refers to a device that selectively absorbs and/or reflects light using the principles of optical interference. In some implementations, an IMOD display element may include a pair of conductive plates, one or both of which may be transparent and/or reflective, wholly or in part, and capable of relative motion upon application of an appropriate electrical signal. For example, one plate may include a stationary layer deposited over, on or supported by a substrate and the other plate may include a reflective membrane separated from the stationary layer by an air gap. The position of one plate in relation to another can change the optical interference of light incident on the IMOD display element. IMOD-based display devices have a wide range of applications, and are anticipated to be used in improving existing products and creating new products, especially those with display capabilities.

Hardware and data processing apparatus may be associated with electromechanical systems. Such hardware and data processing apparatus may include a thin film transistor (TFT) device. A TFT device is a kind of field-effect transistor that includes a source region, a drain region, and a channel region in a semiconducting material.

SUMMARY

The systems, methods and devices of this disclosure each have several innovative aspects, no single one of which is solely responsible for the desirable attributes disclosed herein.

One innovative aspect of the subject matter described in this disclosure can be implemented in a method of manufacturing a thin film transistor (TFT). The method includes providing a substrate, forming an oxide semiconductor layer over the substrate, forming a dielectric oxide layer over the oxide semiconductor layer so that the dielectric oxide layer is contacting the oxide semiconductor layer, and annealing the oxide semiconductor layer. The oxide semiconductor layer is annealed by heating the dielectric oxide layer with an infrared (IR) laser radiation under ambient conditions to a temperature below the melting temperature of the oxide semiconductor layer, where the oxide semiconductor layer and the dielectric oxide layer form part of the TFT.

In some implementations, the dielectric oxide layer substantially absorbs the IR laser radiation during annealing of the oxide semiconductor layer. In some implementations, the dielectric oxide layer has a thickness between about 100 nm and about 1000 nm. In some implementations, the dielectric oxide layer includes at least one of $SiO_2$ and $Al_2O_3$. In some implementations, the temperature for annealing is between about 200° C. and about 500° C. In some implementations, the method further includes forming a source metal on a source region of the oxide semiconductor layer and forming a drain metal on a drain region of the oxide semiconductor layer, where a channel region of the oxide semiconductor layer is defined between the source region and the drain region. The method can further include etching the source metal and the drain metal to expose the channel region of the oxide semiconductor layer, where annealing the dielectric oxide layer occurs after etching the source metal and the drain metal. In some implementations, the dielectric oxide layer can be a passivation layer, where the passivation layer is formed after etching the source metal and the drain metal. In some implementations, the dielectric oxide layer can be an etch stop layer, where the etch stop layer is formed before etching the source metal and the drain metal. In some implementations, the dielectric oxide layer can be a gate dielectric, where the gate dielectric is formed before etching the source metal and the drain metal. In some implementations, the oxide semiconductor layer includes InGaZnO. In some implementations, the IR laser radiation is emitted from a carbon dioxide ($CO_2$) laser.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays, organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
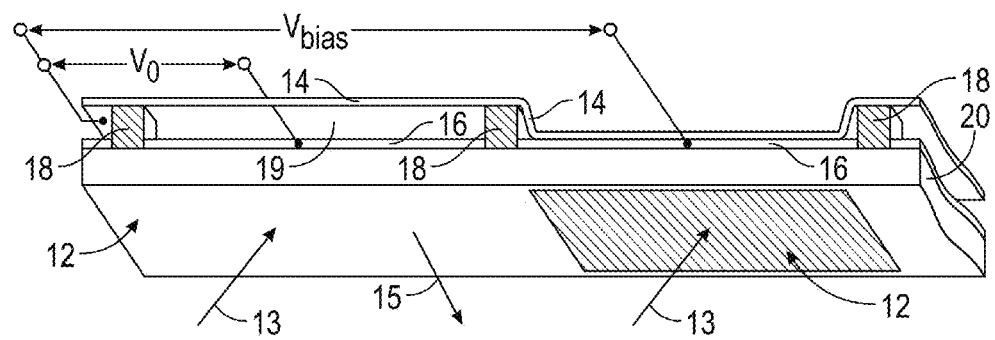
FIG. 1 is an isometric view illustration depicting two adjacent interferometric modulator (IMOD) display elements in a series or array of display elements of an IMOD display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Implementations described herein relate to methods of annealing an oxide semiconductor layer in a TFT. The methods can include providing a substrate with a partially fabricated TFT structure formed on the substrate, where the partially fabricated TFT structure can include an oxide semiconductor layer and a dielectric oxide layer in contact with the oxide semiconductor layer. The oxide semiconductor layer can be annealed by heating the dielectric oxide layer with an infrared (IR) laser. The material of the dielectric oxide layer can be chosen so that it is strongly resonant with the wavelength of the IR laser radiation. When the oxide semiconductor layer is annealed by having the dielectric oxide layer substantially absorb the IR laser radiation, unwanted defects in the oxide semiconductor layer can be removed or otherwise passivated.

Annealing an oxide semiconductor layer in a TFT can reduce the density of defects in the bulk channel and on front or back interfaces of the oxide semiconductor layer. Reducing the density of defects in the TFT can improve TFT performance and reliability. Typically, such defects are removed from the oxide semiconductor layer by using a thermal annealing oven or by exposing the oxide semiconductor layer to ultraviolet (UV) laser radiation. However, in a thermal annealing oven, higher temperatures are more difficult to reach and the thermal anneal is applied globally rather than locally. Moreover, with UV laser radiation, the oxide semiconductor layer may be exposed to atmospheric conditions or otherwise require a controlled atmosphere, and UV laser radiation may not be absorbed efficiently by the oxide semiconductor layer. UV laser radiation may cause the threshold voltage to shift negatively and may induce additional defects, such as oxygen vacancies, thereby requiring a tightly controlled atmosphere (e.g., oxygen-rich), requiring additional surface treatment, or requiring a special capping layer.

Particular implementations of the subject matter described in this disclosure can be implemented to realize one or more of the following potential advantages. Rather than annealing the oxide semiconductor layer using a thermal annealing oven or exposing the oxide semiconductor layer to UV laser radiation, a dielectric oxide layer in contact with the oxide semiconductor layer absorbs IR laser radiation. The dielectric oxide layer is heated to remove unwanted defects from the oxide semiconductor layer to improve TFT performance and reliability. The dielectric oxide layer can provide a barrier to prevent or otherwise limit the diffusion of oxygen from the atmosphere into the oxide semiconductor layer so that the oxygen vacancy concentration in the oxide semiconductor layer can be balanced. The dielectric oxide layer can serve as a mask to facilitate more localized heating of the oxide semiconductor layer. Furthermore, the IR laser radiation can be more efficiently converted to heat by absorption in the dielectric oxide layer compared to UV laser radiation because the IR laser radiation may be strongly resonant with the bonds in the dielectric oxide layer. In addition, annealing times can be reduced by a few or several orders of magnitude since only localized regions that need to be heated are heated, and the radiation to heat conversion is more efficient with IR laser radiation absorbed by the dielectric oxide layer than with UV laser radiation absorbed by the oxide semiconductor layer. This can avoid damaging other components of the TFT or the display device while reducing the overall manufacturing cost.

An example of a suitable EMS or MEMS device or apparatus, to which the described implementations of the TFT may apply, is a reflective display device. Reflective display devices can incorporate interferometric modulator (IMOD) display elements that can be implemented to selectively absorb and/or reflect light incident thereon using principles of optical interference. IMOD display elements can include a partial optical absorber, a reflector that is movable with respect to the absorber, and an optical resonant cavity defined between the absorber and the reflector. In some implementations, the reflector can be moved to two or more different positions, which can change the size of the optical resonant cavity and thereby affect the reflectance of the IMOD. The reflectance spectra of IMOD display elements can create fairly broad spectral bands that can be shifted across the visible wavelengths to generate different colors. The position of the spectral band can be adjusted by changing the thickness of the optical resonant cavity. One way of changing the optical resonant cavity is by changing the position of the reflector with respect to the absorber.

FIG. 1 is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 1 includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 1, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 1 and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 μm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 1, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 1. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
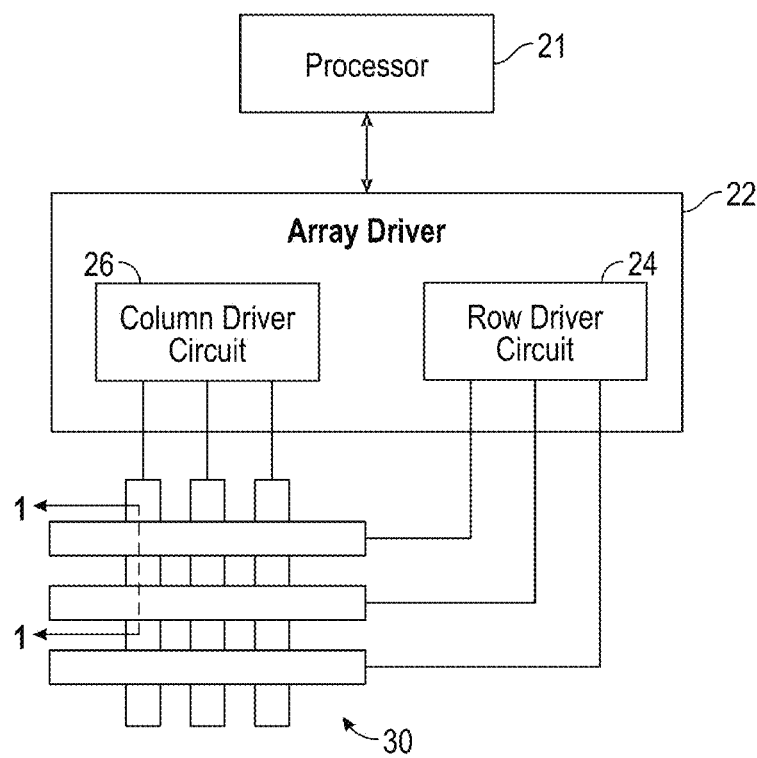
FIG. 2 is a system block diagram illustrating an electronic device incorporating an IMOD-based display including a three element by three element array of IMOD display elements.

FIG. 2 is a system block diagram illustrating an electronic device incorporating an IMOD-based display including a three element by three element array of IMOD display elements. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 1 is shown by the lines 1-1 in FIG. 2. Although FIG. 2 illustrates a 3×3 array of IMOD display elements for the sake of clarity, the display array 30 may contain a very large number of IMOD display elements, and may have a different number of IMOD display elements in rows than in columns, and vice versa.

Figure 3A:
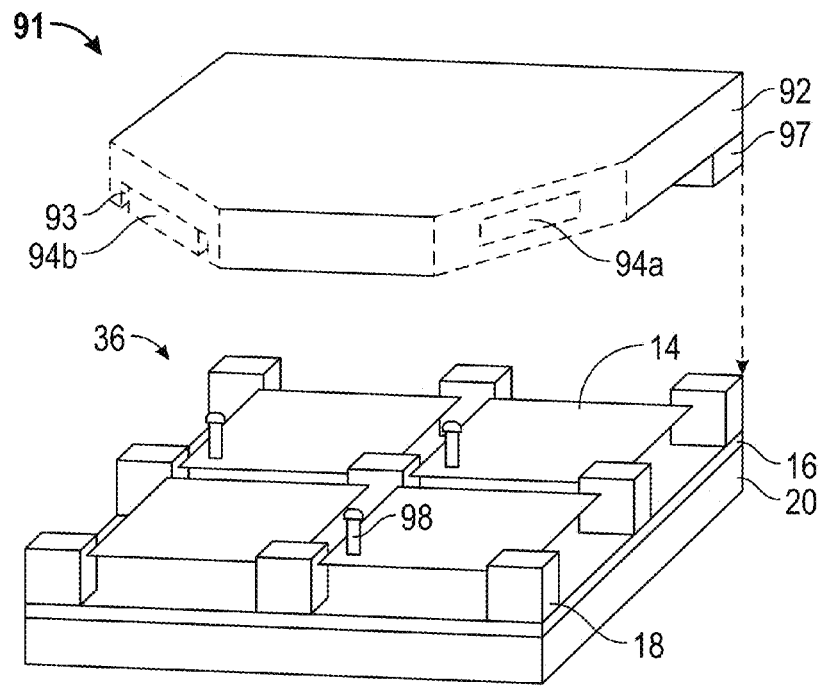
FIGS. 3A and 3B are schematic exploded partial perspective views of a portion of an electromechanical systems (EMS) package including an array of EMS elements and a backplate.
Figure 3B:
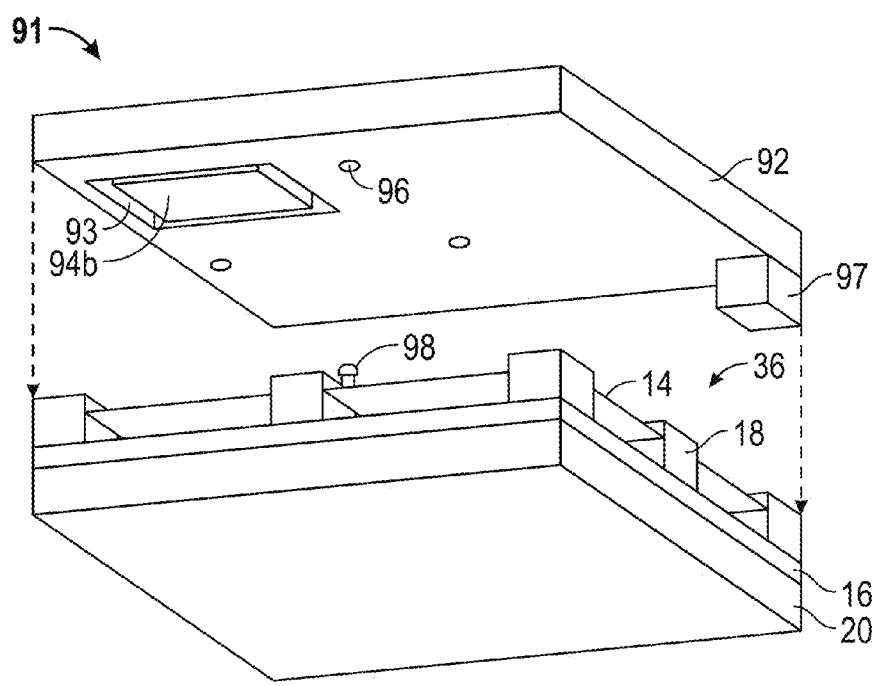

FIGS. 3A and 3B are schematic exploded partial perspective views of a portion of an EMS package 91 including an array 36 of EMS elements and a backplate 92. FIG. 3A is shown with two corners of the backplate 92 cut away to better illustrate certain portions of the backplate 92, while FIG. 3B is shown without the corners cut away. The EMS array 36 can include a substrate 20, support posts 18, and a movable layer 14. In some implementations, the EMS array 36 can include an array of IMOD display elements with one or more optical stack portions 16 on a transparent substrate, and the movable layer 14 can be implemented as a movable reflective layer.

The backplate 92 can be essentially planar or can have at least one contoured surface (e.g., the backplate 92 can be formed with recesses and/or protrusions). The backplate 92 may be made of any suitable material, whether transparent or opaque, conductive or insulating. Suitable materials for the backplate 92 include, but are not limited to, glass, plastic, ceramics, polymers, laminates, metals, metal foils, Kovar and plated Kovar.

As shown in FIGS. 3A and 3B, the backplate 92 can include one or more backplate components 94a and 94b, which can be partially or wholly embedded in the backplate 92. As can be seen in FIG. 3A, backplate component 94a is embedded in the backplate 92. As can be seen in FIGS. 3A and 3B, backplate component 94b is disposed within a recess 93 formed in a surface of the backplate 92. In some implementations, the backplate components 94a and/or 94b can protrude from a surface of the backplate 92. Although backplate component 94b is disposed on the side of the backplate 92 facing the substrate 20, in other implementations, the backplate components can be disposed on the opposite side of the backplate 92.

The backplate components 94a and/or 94b can include one or more active or passive electrical components, such as transistors, capacitors, inductors, resistors, diodes, switches, and/or integrated circuits (ICs) such as a packaged, standard or discrete IC. Other examples of backplate components that can be used in various implementations include antennas, batteries, and sensors such as electrical, touch, optical, or chemical sensors, or thin-film deposited devices.

In some implementations, the backplate components 94a and/or 94b can be in electrical communication with portions of the EMS array 36. Conductive structures such as traces, bumps, posts, or vias may be formed on one or both of the backplate 92 or the substrate 20 and may contact one another or other conductive components to form electrical connections between the EMS array 36 and the backplate components 94a and/or 94b. For example, FIG. 3B includes one or more conductive vias 96 on the backplate 92 which can be aligned with electrical contacts 98 extending upward from the movable layers 14 within the EMS array 36. In some implementations, the backplate 92 also can include one or more insulating layers that electrically insulate the backplate components 94a and/or 94b from other components of the EMS array 36. In some implementations in which the backplate 92 is formed from vapor-permeable materials, an interior surface of backplate 92 can be coated with a vapor barrier (not shown).

The backplate components 94a and 94b can include one or more desiccants which act to absorb any moisture that may enter the EMS package 91. In some implementations, a desiccant (or other moisture absorbing materials, such as a getter) may be provided separately from any other backplate components, for example as a sheet that is mounted to the backplate 92 (or in a recess formed therein) with adhesive. Alternatively, the desiccant may be integrated into the backplate 92. In some other implementations, the desiccant may be applied directly or indirectly over other backplate components, for example by spray-coating, screen printing, or any other suitable method.

In some implementations, the EMS array 36 and/or the backplate 92 can include mechanical standoffs 97 to maintain a distance between the backplate components and the display elements and thereby prevent mechanical interference between those components. In the implementation illustrated in FIGS. 3A and 3B, the mechanical standoffs 97 are formed as posts protruding from the backplate 92 in alignment with the support posts 18 of the EMS array 36. Alternatively or in addition, mechanical standoffs, such as rails or posts, can be provided along the edges of the EMS package 91.

Although not illustrated in FIGS. 3A and 3B, a seal can be provided which partially or completely encircles the EMS array 36. Together with the backplate 92 and the substrate 20, the seal can form a protective cavity enclosing the EMS array 36. The seal may be a semi-hermetic seal, such as a conventional epoxy-based adhesive. In some other implementations, the seal may be a hermetic seal, such as a thin film metal weld or a glass frit. In some other implementations, the seal may include polyisobutylene (PIB), polyurethane, liquid spin-on glass, solder, polymers, plastics, or other materials. In some implementations, a reinforced sealant can be used to form mechanical standoffs.

In alternate implementations, a seal ring may include an extension of either one or both of the backplate 92 or the substrate 20. For example, the seal ring may include a mechanical extension (not shown) of the backplate 92. In some implementations, the seal ring may include a separate member, such as an O-ring or other annular member.

In some implementations, the EMS array 36 and the backplate 92 are separately formed before being attached or coupled together. For example, the edge of the substrate 20 can be attached and sealed to the edge of the backplate 92 as discussed above. Alternatively, the EMS array 36 and the backplate 92 can be formed and joined together as the EMS package 91. In some other implementations, the EMS package 91 can be fabricated in any other suitable manner, such as by forming components of the backplate 92 over the EMS array 36 by deposition.

Hardware and data processing apparatus may be associated with EMS structures. Such hardware and data processing apparatus may include a transistor switch, such as a thin film transistor (TFT). EMS display elements in a display device may be arranged in an array such as a two-dimensional grid and addressed by circuits associated with the rows and columns of the array. Row driver circuits may drive the gates of transistor switches that select a particular row to be addressed, and common driver circuits may provide a bias to a given row of display elements that may be synchronously updated with a row refresh.

A display device can include an array of display elements, which can be referred to as pixels. Some displays can include hundreds, thousands, or millions of pixels arranged in hundreds or thousands of rows and hundreds and thousands of columns. Each pixel can be driven by one or more TFTs. A TFT is a type of field-effect transistor made by depositing thin films of a semiconductor layer as well as one or more dielectric layers and metallic layers over a substrate. With increasing developments in flat panel displays, systems-on-glass, display devices, mobile devices, wearable devices, and the like, there is a growing demand for high performance TFTs.

Figure 4A:
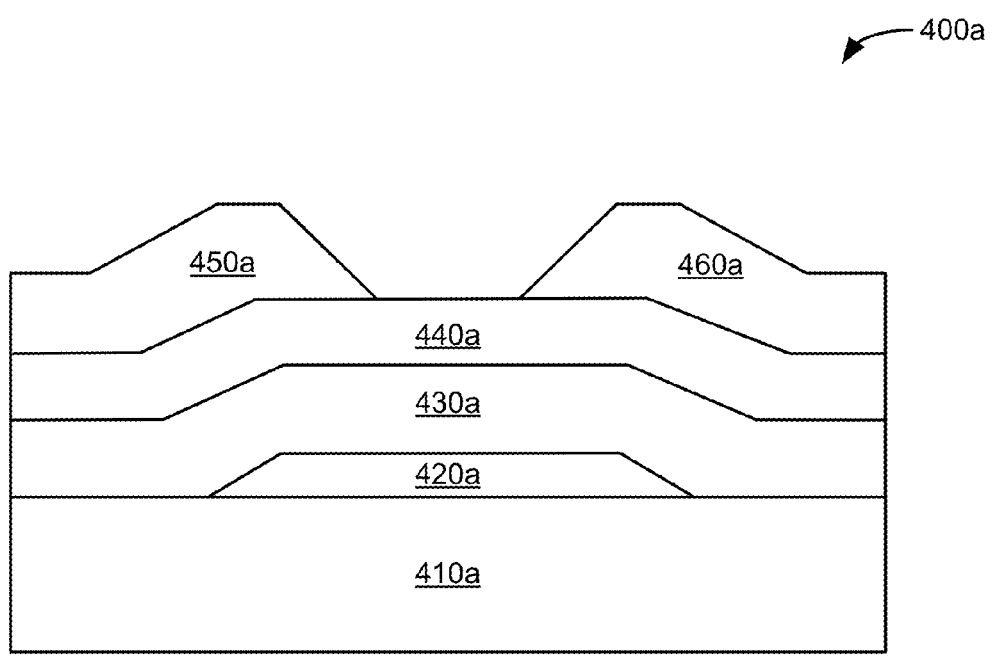
FIG. 4A is an example of a cross-sectional diagram illustrating a bottom gate TFT according to some implementations.
Figure 4B:
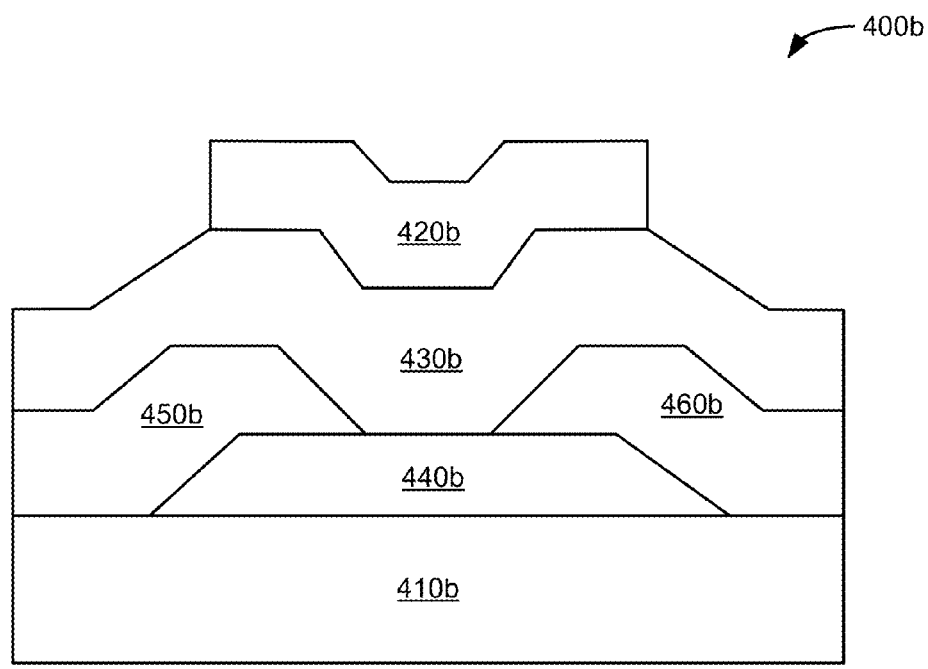
FIG. 4B is an example of a cross-sectional diagram illustrating a top gate TFT according to some implementations.

Generally, a TFT can include a source region, a drain region, and a channel region in the semiconductor layer. In other words, a TFT can be a three-terminal device that includes a source terminal, a drain terminal, and a gate terminal for modulating the conductivity of a channel. Some types of TFTs can be defined in terms of the location of the gate terminal. For example, types of TFT geometries can include a bottom gate geometry and a top gate geometry. FIG. 4A is an example of a cross-sectional diagram illustrating a bottom gate TFT according to some implementations. In FIG. 4A, a bottom gate TFT 400a includes a substrate 410a, a gate metal 420a over the substrate 410a, a gate dielectric 430a over the gate metal 420a, a semiconductor layer 440a over the gate dielectric 430a, a source metal 450a over a source region of the semiconductor layer 440a, and a drain metal 460a over a drain region of the semiconductor layer 440a, where a channel region in the semiconductor layer 440a is between the source region and the drain region. FIG. 4B is an example of a cross-sectional diagram illustrating a top gate TFT according to some implementations. In FIG. 4B, a top gate TFT 400b includes a substrate 410b, a semiconductor layer 440b over the substrate 410b, a source metal 450b over a source region of the semiconductor layer 440b, a drain metal 460b over a drain region of the semiconductor layer 440b, a gate dielectric 430b over the source metal 450b, and a gate metal 420b over the gate dielectric 430b, where a channel region is between the source region and the drain region of the semiconductor layer 440b.

In FIGS. 4A and 4B, the bottom gate TFT 400a and the top gate TFT 400b can include metal oxide TFTs, where the semiconductor layers 440a and 440b can include a metal oxide. In metal oxide TFTs, metal oxide semiconductor is deposited as an active channel layer in the TFT. A metal oxide TFT can have a wide bandgap, light transparency, high mobility in the amorphous state, and low deposition temperature. Low temperature and amorphous metal oxide TFTs may be very useful in a variety of electronic applications, but such properties may lead to challenges in mobility and stability.

Aspects of the performance and physical stability of a TFT can characterized in terms of the TFT's mobility ($\mu$) and threshold voltage ($V_{th}$). The semiconductor layer in the TFT may have defects, such as vacancies and interstitial defects, in the bulk as well as in the front and back interfaces. In a metal oxide TFT, one type of defect can include oxygen vacancies, which can affect the TFT's mobility. Other defects in a metal oxide TFT can include broken bonds and hydrogen impurities. Annealing the semiconductor layer can improve the TFT's performance and reliability by removing or otherwise passivating such undesirable defects, thereby increasing the mobility and reducing the threshold voltage of the TFT.

Various annealing techniques may be applied to a semiconductor layer in a TFT. Thermal annealing may be used to remove unwanted defects, but reaching high temperatures can be difficult with thermal annealing, and thermal annealing is global rather than local to particular regions of the TFT. Furthermore, removal of defects at the back channel interface may be limited in thermal annealing, and thermal annealing may require careful control of the surrounding atmosphere. Alternatively, laser annealing may be used to remove unwanted defects. However, metal oxides have a wide bandgap and can absorb energy in the deep UV band. Using UV laser radiation can be expensive and can inadvertently heat or melt surrounding materials and/or undesirably crystallize the metal oxide.

A method is provided to laser anneal an oxide semiconductor layer in a TFT by heating a dielectric oxide layer in thermal communication with the oxide semiconductor layer. The laser utilized in the laser annealing process is an infrared (IR) laser, such as a $CO_2$ laser. The IR laser radiation is substantially absorbed by the dielectric oxide layer in contact with the oxide semiconductor layer. Heating the dielectric oxide layer in turn locally heats the oxide semiconductor layer to anneal the oxide semiconductor layer. In some implementations, the dielectric oxide layer can be one of a passivation layer, an etch stop layer, and a gate dielectric layer.

Figure 5A:
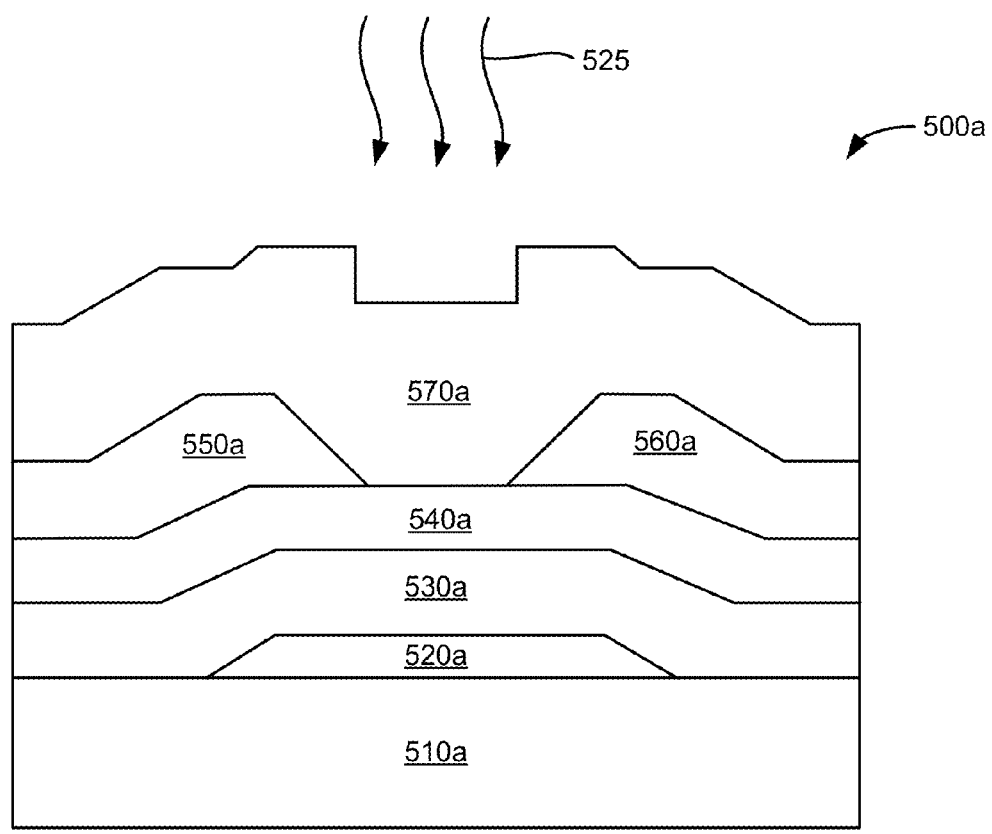
FIG. 5A is an example of a cross-sectional schematic diagram illustrating a bottom gate TFT with a passivation layer exposed to laser radiation according to some implementations.

FIG. 5A is an example of a cross-sectional schematic diagram illustrating a bottom gate TFT with a passivation layer exposed to laser radiation according to some implementations. The bottom gate TFT 500a can include a substrate 510a made of any suitable substrate materials, including a substantially transparent material, such as glass or plastic. Substantial transparency as used herein can be defined as transmittance of visible light of about 70% or more, such as about 80% or more, or about 90% or more. Glass substrates (sometimes referred to as glass plates or panels) may be or include a borosilicate glass, a soda lime glass, photoglass, quartz, Pyrex, or other suitable glass material. A non-glass substrate can be used, such as a polycarbonate, acrylic, polyimide, polyethylene terephthalate (PET), or polyether ether ketone (PEEK) substrate. Other suitable substrate materials can include flexible substrate materials and substrate materials that can be processed at relatively low temperatures. In some implementations, the substrate 510a on which the bottom gate TFT 500a is fabricated can have dimensions of a few microns to hundreds of microns.

In FIG. 5A, the bottom gate TFT 500a further includes a gate metal 520a disposed on the substrate 510a. In some implementations, the gate metal 520a may include any number of different metals, including aluminum (Al), copper (Cu), molybdenum (Mo), tantalum (Ta), chromium (Cr), neodymium (Nd), tungsten (W), titanium (Ti), gold (Au), nickel (Ni), and alloys containing any of these elements. In some implementations, the gate metal 520a includes two or more layers of different metals arranged in a stacked structure. In some implementations, the gate metal 520a can have a thickness between about 50 nm and about 500 nm, or between about 100 nm and about 250 nm.

In manufacturing the bottom gate TFT 500a in FIG. 5A, the gate metal 520a may be formed using any number of deposition, masking, and/or etching steps. The gate metal 520a may be deposited using deposition processes as known by a person having ordinary skill in the art, including physical vapor deposition (PVD) processes, chemical vapor deposition (CVD) processes, and atomic layer deposition (ALD) processes. PVD processes include thermal evaporation deposition, sputter deposition and pulsed laser deposition (PLD). For example, the gate metal 520a may include Mo and may be deposited using sputter deposition.

The bottom gate TFT 500a can further include a gate dielectric 530a disposed on the gate metal 520a. The gate dielectric 530a may also be referred to as a gate insulator. In some implementations, the gate dielectric 530a may include any number of different dielectric materials, including silicon dioxide ($SiO_2$), aluminum oxide ($Al_2O_3$), hafnium oxide ($HfO_2$), titanium oxide ($TiO_2$), silicon oxynitride (SiON), or silicon nitride (SiN). In some implementations, the gate dielectric 530a can include two or more layers of dielectric materials arranged in a stacked structure. In some implementations, a thickness of the gate dielectric 530a can be between about 50 nm and about 500 nm, or between about 100 nm and about 250 nm.

In manufacturing the bottom gate TFT 500a in FIG. 5A, the gate dielectric 530a may be formed on the gate metal 520a using any number of deposition, masking, and/or etching steps. The gate dielectric 530a may be deposited using deposition processes as known by a person having ordinary skill in the art, including PVD processes, CVD processes including PECVD processes, and ALD processes. For example, the gate dielectric 530a may include $SiO_2$ deposited using a PECVD process at a processing temperature greater than about 300° C. Forming the gate dielectric 530a may include etching the gate dielectric 530a using any suitable etching process.

Additionally, the bottom gate TFT 500a can further include an oxide semiconductor layer 540a on the gate dielectric 530a. The oxide semiconductor layer 540a can include any semiconducting metal oxide material. In some implementations, the semiconducting metal oxide material is amorphous and can include indium (In)-containing, zinc (Zn)-containing, tin (Sn)-containing, hafnium (Hf)-containing, and gallium (Ga)-containing oxide semiconductors. Specific examples of amorphous oxide semiconductors include InGaZnO, InZnO, InHfZnO, InSnZnO, SnZnO, InSnO, GaZnO, and ZnO. In some implementations, the channel region of the oxide semiconductor layer 540a may be aligned with the gate metal 520a. The channel region may be between a source region and a drain region of the oxide semiconductor layer 540a. In some implementations, the oxide semiconductor layer 540a is about 10 nm to about 100 nm thick.

In manufacturing the bottom gate TFT 500a in FIG. 5A, the oxide semiconductor layer 540a can be formed on the gate dielectric 530a using any number of depositing, masking, and/or etching steps. Forming the oxide semiconductor layer 540a may occur at relatively low temperatures, such as less than about 100° C. Because the formation of the oxide semiconductor layer 540a may occur at relatively low processing temperatures, defects such as oxygen vacancies may be present. In some implementations, the oxide semiconductor layer 540a is deposited with a PVD process. PVD processes include PLD, sputter deposition, electron beam physical vapor deposition (e-beam PVD), and evaporative deposition. For example, the oxide semiconductor layer 540a may include InGaZnO and may be deposited using sputter deposition. The oxide semiconductor layer 540a may be etched using a dry (e.g., plasma) etching process or a wet chemical etching process, depending in part on the material of the oxide semiconductor layer 540a.

Furthermore, the bottom gate TFT 500a can include a source metal 550a over a source region of the oxide semiconductor layer 540a and a drain metal 560a over a drain region of the oxide semiconductor layer 540a. The source metal 550a and the drain metal 560a may include any number of different metals, including Mo, W, Au, Pt, Ag, Mg, Mn, Ti, Al, Cu, Ta, Cr, Nd, Ni, and alloys containing any of these elements. For example, the source metal 550a and the drain metal 560a may include a stable contact metal such as Mo, W, Au, Pt, and Ag. In some implementations, each of the source metal 550a and the drain metal 560a includes two or more sub-layers of different metals arranged in a stacked structure. In some implementations, each of the source metal 550a and the drain metal 560a can have a thickness between about 50 nm and about 500 nm, or between about 100 nm and about 250 nm.

In manufacturing the bottom gate TFT 500a in FIG. 5A, the source metal 550a and the drain metal 560a may be formed using any number of deposition, masking, and/or etching steps. For example, a metal layer may be deposited over the oxide semiconductor layer 540a using deposition processes as known by a person having ordinary skill in the art, including PVD processes, CVD processes, and ALD processes. The metal layer may be etched using a dry (e.g., plasma) etching process or a wet chemical etching process to form the source metal 550a over the source region of the oxide semiconductor layer 540a and the drain metal 560a over the drain region of the oxide semiconductor layer 540a. The etching of the metal layer to form the source metal 550a and the drain metal 560a may cause undesirable defects at the back channel interface of the oxide semiconductor layer 540a to be introduced. The back channel interface represents a surface of the oxide semiconductor layer 540a that interfaces with a dielectric oxide layer. The back channel interface may be vulnerable to various environmental agents, such as UV, moisture, hydrogen, and other agents in the atmosphere. Moreover, when the etching step is performed, the back channel interface may get partially etched or otherwise damaged.

The bottom gate TFT 500a may further include a passivation layer 570a over the source metal 550a, over the drain metal 560a, and over the oxide semiconductor layer 540a. The passivation layer 570a may contact the oxide semiconductor layer 540a at the back channel interface of the oxide semiconductor layer 540a. The passivation layer 570a can include any number of different dielectric materials, including $SiO_2$, $Al_2O_3$, $HfO_2$, and SiON. The passivation layer 570a can be relatively thick and can serve to protect the bottom gate TFT 500a from the external environment. In some implementations, the passivation layer 570a can be between about 100 nm and about 1000 nm thick, or between about 300 nm and about 500 nm thick. The passivation layer 570a can also provide insulation between the source metal 550a and the drain metal 560a.

In manufacturing the bottom gate TFT 500a in FIG. 5A, the passivation layer 570a may be formed using any number of deposition, masking, and/or etching steps. The passivation layer 570a may be deposited using deposition processes as known by a person having ordinary skill in the art, including PVD processes, CVD processes, and ALD processes.

As illustrated in the example in FIG. 5A, the oxide semiconductor layer 540a may be annealed by exposure to laser radiation 525. The laser radiation 525 may be emitted from an IR laser source, such as a $CO_2$ laser. The IR laser source may be configured to emit IR laser radiation 525 having a wavelength between about 8.9 μm and about 10.6 μm. In some implementations, IR lasers may be less expensive than UV lasers. In some implementations, IR laser radiation 525 may not readily heat up an oxide semiconductor layer 540a and other surrounding layers compared to UV radiation. In some implementations, IR laser radiation 525 may be substantially transparent to the oxide semiconductor layer 540a.

The material of the passivation layer 570a may be selected with an appropriate refractive index and absorption index to correspond to the wavelength of the IR laser radiation 525. In particular, the material of the passivation layer 570a may be selected with an appropriate refractive index and absorption index to correspond to IR laser radiation 525 having a wavelength between about 8.9 μm and about 10.6 μm. The passivation layer 570a can include a dielectric oxide material that efficiently converts the IR laser radiation 525 to heat. In some implementations, the dielectric oxide material can include $SiO_2$ or $Al_2O_3$.

Figure 6A:
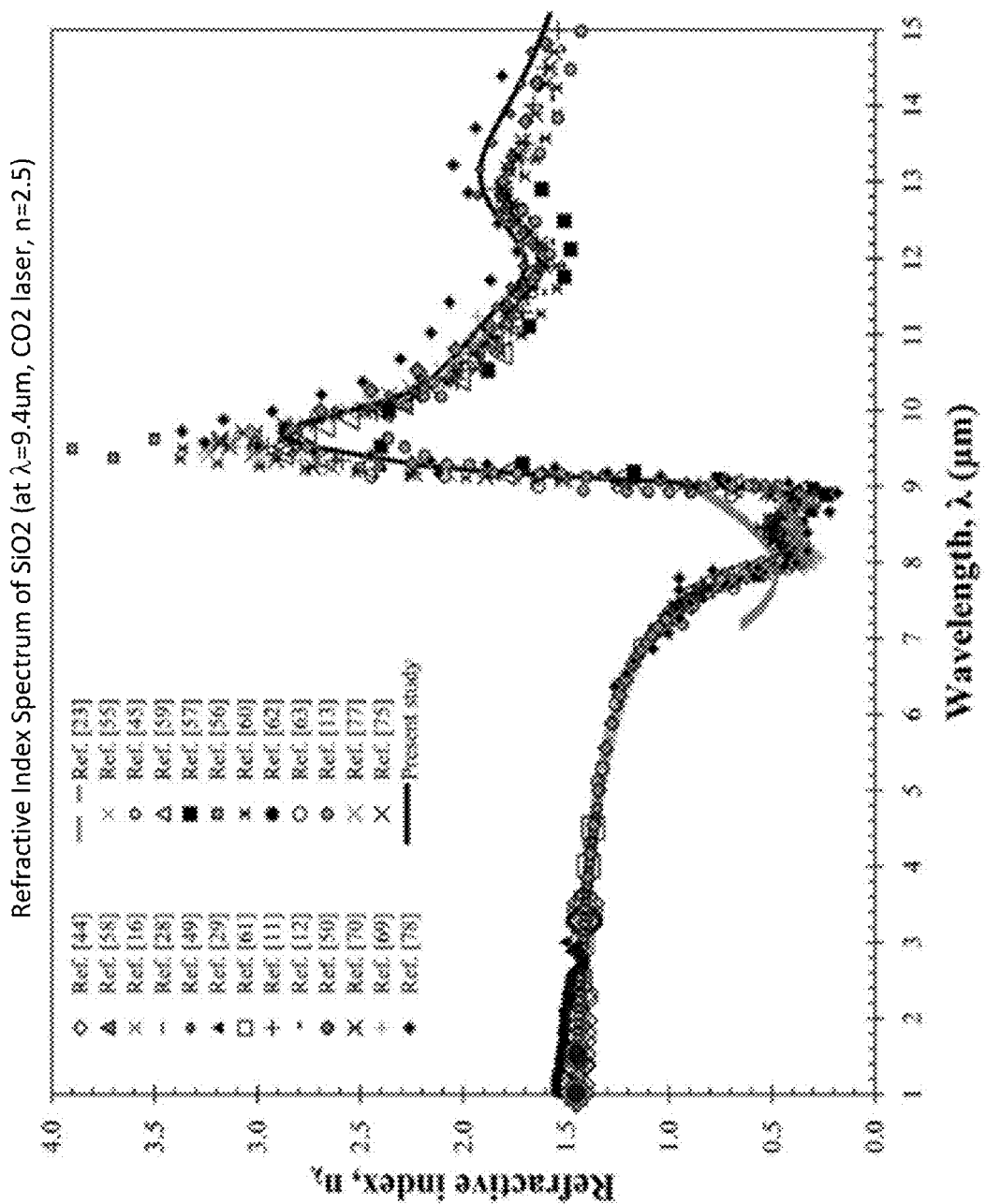
FIG. 6A is an example of a graph illustrating a refractive index spectrum for a dielectric oxide.

FIG. 6A is an example of a graph illustrating a refractive index spectrum for a dielectric oxide. For a dielectric oxide made of $SiO_2$, the refractive index (n) of $SiO_2$ is 2.5 for a $CO_2$ laser emitting a wavelength of 9.4 μm. How much radiation is reflected from $SiO_2$ can be determined using the Fresnel equation: $R=|(n_1-n_2)/(n_1+n_2)|^2$, where $n_1$ (air)=1 and $n_2$ ($SiO_2$)=2.5, the reflection power lost through $SiO_2$ is about 18%.

Figure 6B:
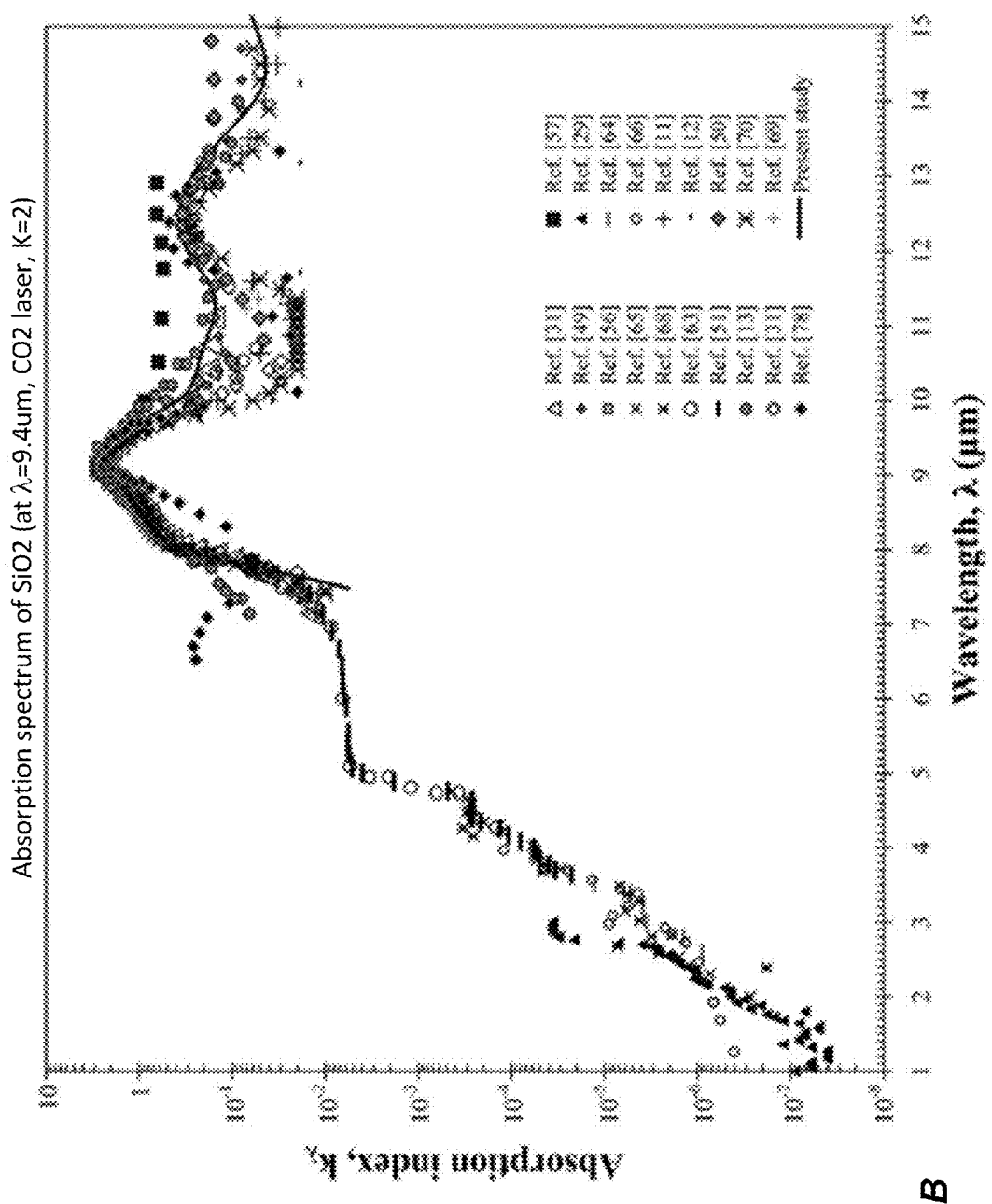
FIG. 6B is an example of a graph illustrating an absorption spectrum for a dielectric oxide.

FIG. 6B is an example of a graph illustrating an absorption spectrum for a dielectric oxide. The absorption spectrum for $SiO_2$ maps an extinction coefficient ($k_\lambda$) as a function of wavelength. For a wavelength of light of 9.4 μm, the extinction coefficient of $SiO_2$ is 2. An absorption coefficient (α) can be calculated from the extinction coefficient using the equation: $\alpha=4\pi k_\lambda/\lambda_o$, where $\lambda_o$ is the wavelength of radiation in vacuum. In FIG. 6B, the absorption coefficient α is 2.68 $\mu m^{-1}$. According to Beer Lambert law, one can determine the amount of radiation that a layer of $SiO_2$ will transmit using the equation: $T=I/I_o=e^{-\alpha L}$. Thus, for a 0.5 μm thick layer of $SiO_2$, the layer will absorb about 74% of the IR laser radiation having a wavelength of 9.4 μm.

In FIG. 6B, the absorption spectrum for $SiO_2$ shows multiple absorption peaks that can correspond to multiple vibrational modes of heating. Lattice vibrations in $SiO_2$ may convert the IR laser radiation to heat. The vibrational modes of heating may correspond to wavelengths that are strongly resonant with the O—Si—O bonds in the layer of $SiO_2$. For example, $SiO_2$ may have a first absorption peak between about 9.0 µm and about 9.5 µm and a second absorption peak between about 11.9 µm and about 12.6 µm. The first absorption peak may correspond to asymmetric bond stretching (ABS) and the second absorption peak may correspond to symmetric bond stretching (SBS). A laser source may be selected to emit radiation around an absorption peak so that the radiation may be resonant with the O—Si—O bonds. A $CO_2$ laser emitting radiation having a wavelength of about 9.4 µm may strongly resonate with the O—Si—O bonds in a dielectric oxide layer including $SiO_2$.

Returning to FIG. 5A, the material of a passivation layer 570a may be selected to substantially absorb the IR laser radiation 525. Thus, the IR laser radiation 525 may be efficiently converted to heat without being transmitted or otherwise reflected by the passivation layer 570a. As used herein, substantial absorption may be defined as absorption of the IR laser radiation 525 of about 50% or more, such as about 60% or more, or about 70% or more. The more IR laser radiation 525 that the passivation layer 570a absorbs, the less IR laser radiation 525 that is reflected or transmitted to other surrounding layers. For example, to achieve absorption of 70% or more, the dielectric oxide material can have an absorption coefficient of equal to or greater than about 2.4 $\mu m^{-1}$ for thicknesses of about 500 nm or greater. To achieve absorption of 70% or more, the dielectric oxide material can have an absorption coefficient of equal to or greater than about 4.0 $\mu m^{-1}$ for thicknesses of about 300 nm or greater.

With the material of the passivation layer 570a strongly resonant with the IR laser radiation 525 and substantially absorbing of the IR laser radiation 525, the heat generated in the passivation layer 570a may transfer to the underlying oxide semiconductor layer 540a. The heat transfer may take place across the back channel interface of the oxide semiconductor layer 540a to anneal the oxide semiconductor layer 540a. The oxide semiconductor layer 540a may be heated to a temperature without crystallizing the oxide semiconductor layer 540a or melting the oxide semiconductor layer 540a. In some implementations, the passivation layer 570a may be heated to a temperature of between about 200° C. and about 500° C. Accordingly, the temperature for annealing the oxide semiconductor layer 540a is between about 200° C. and about 500° C.

Defects in the oxide semiconductor layer 540a, such as oxygen vacancies, may be annealed out or otherwise passivated within such a temperature range. The defects may be annealed out or otherwise passivated at the back channel interface and in the bulk layer of the oxide semiconductor layer 540a. Annealing the oxide semiconductor layer 540a by heating the passivation layer 570a can reduce a defect density at the back channel interface. In addition, the temperature for annealing of the oxide semiconductor layer 540a may also facilitate densification of the oxide semiconductor layer 540a, which can lead to increased robustness of the oxide semiconductor layer 540a and reduce the transport of oxygen, hydrogen, and other gases through the back channel interface.

Laser annealing of the oxide semiconductor layer 540a may be maintained at a temperature below a crystallization temperature of the oxide semiconductor layer 540a. For example, if the oxide semiconductor layer 540a includes InGaZnO and laser annealing is performed at a temperature of about 500° C. or less, then the oxide semiconductor layer 540a can remain in an amorphous state. An InGaZnO semiconductor can have a theoretical density of between about 6.3 $g/cm^3$ and about 6.5 $g/cm^3$. A typical sputtering target density is between about 6.3 $g/cm^3$ and about 6.4 $g/cm^3$.

Using x-ray diffraction, experimental data over a sample of InGaZnO shows an as-deposited and thermally-annealed InGaZnO semiconductor measured with a density of about 6.2 $g/cm^3$. This represents about 95% of the theoretical density and slightly over 96% of the sputtering target density. However, an InGaZnO semiconductor that is laser annealed by heating a dielectric oxide layer with IR radiation does not crystallize from its amorphous state. Furthermore, the density can be between about 96% and about 98% of the theoretical density, which represents a slight improvement over the as-deposited and thermally-annealed InGaZnO semiconductor.

The passivation layer 570a may transfer heat to the oxide semiconductor layer 540a and provide localized heating to the oxide semiconductor layer 540a. In some implementations, the heat transfer from the passivation layer 570a may be localized to the channel region of the oxide semiconductor layer 540a. Furthermore, the passivation layer 570a may permit the annealing process to occur under ambient conditions. While UV, moisture, hydrogen, and other agents in the atmosphere may need to be controlled using alternative mechanisms (e.g., thermal annealing, UV exposure) for annealing the oxide semiconductor layer 540a, the passivation layer 570a may protect the back channel interface from the atmosphere.

In some implementations, the ambient conditions may provide a source of oxygen during irradiation of the passivation layer 570a. With ambient conditions, oxygen may be present to passivate defects during the annealing process. Defects in the oxide semiconductor layer 540a may be passivated by oxygen from the ambient environment and/or the passivation layer 570a. Furthermore, the passivation layer 570a may limit the diffusion of oxygen across the boundary during the annealing process. Since the passivation layer 570a may include an oxide, the stoichiometry of oxygen atoms in the passivation layer 570a may be controlled. This can provide an excess concentration of oxygen so that the net diffusion of oxygen out of the oxide semiconductor layer 540a may be eliminated or reduced.

In addition or in the alternative, annealing an oxide semiconductor layer 540a may occur by locally heating the gate dielectric 530a. The gate dielectric 530a underlying the oxide semiconductor layer 540a may include a material that is strongly resonant with the IR laser radiation 525 to substantially absorb the IR laser radiation 525. In some implementations, the gate dielectric 530a may be made of the same material as the passivation layer 570a. Heating the gate dielectric 530a with IR laser radiation 525 may anneal or passivate defects in the front channel interface and bulk channel of the oxide semiconductor layer 540a. Thus, in some implementations, the passivation layer 570a and the gate dielectric 530a may be heated to anneal the front channel interface, back channel interface, and the bulk channel of the oxide semiconductor layer 540a.

Figure 5B:
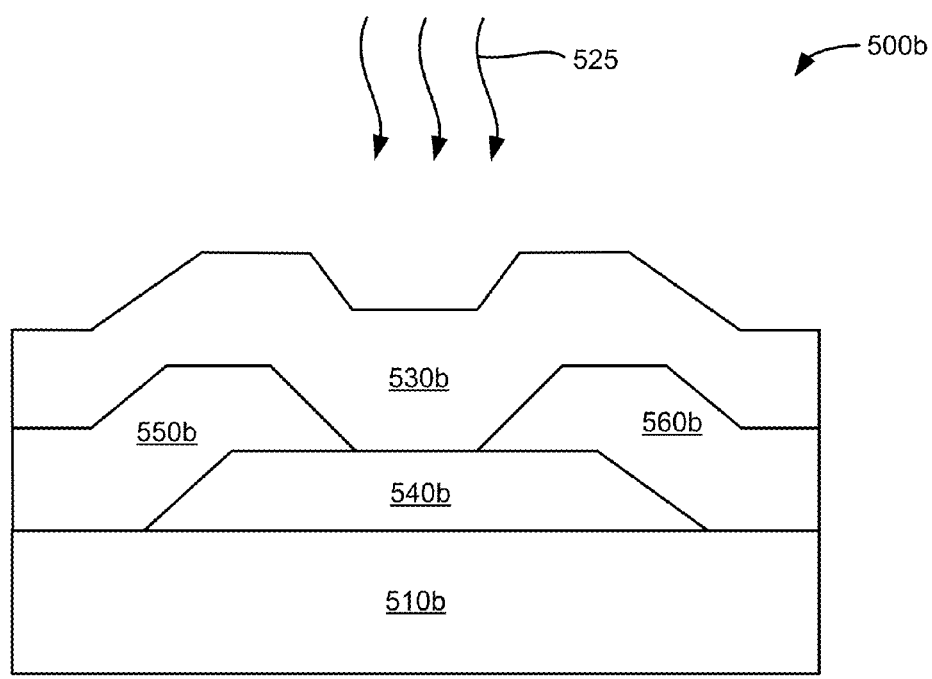
FIG. 5B is an example of a cross-sectional schematic diagram illustrating a partially fabricated top gate TFT with a gate dielectric layer exposed to laser radiation according to some implementations.

Heating a dielectric oxide layer to anneal an oxide semiconductor layer in contact with the dielectric oxide layer may be achieved in other TFT implementations regardless of the geometry of the TFT. Accordingly, an IR laser may be used to heat a dielectric oxide layer to anneal an oxide semiconductor layer in a top gate TFT. FIG. 5B is an example of a cross-sectional schematic diagram illustrating a partially fabricated top gate TFT with a gate dielectric layer exposed to laser radiation according to some implementations. In the example in FIG. 5B, the partially fabricated top gate TFT 500b may be annealed prior to formation of a top gate metal.

The partially fabricated top gate TFT 500b may include a substrate 510b made of any suitable substrate material, including any substrate material described earlier herein. The partially fabricated top gate TFT 500b may further include an oxide semiconductor layer 540b formed on the substrate 510b. A source metal 550b may be formed over a source region of the oxide semiconductor layer 540b and a drain metal 560b may be formed over a drain region of the oxide semiconductor layer 560b, where a channel region of the oxide semiconductor layer 540b is between the source region and the drain region. Aspects of the substrate 510b, the oxide semiconductor layer 540b, the source metal 550b, and the drain metal 560b may be similarly described with reference to the substrate 510a, the oxide semiconductor layer 540a, the source metal 550a, and the drain metal 560a in the bottom gate TFT 500a of FIG. 5A.

A gate dielectric 530b may be formed over the source metal 550b, the drain metal 560b, and the oxide semiconductor layer 540b. The gate dielectric 530b may contact the oxide semiconductor layer 540b at the back channel interface. The gate dielectric 530b may include any dielectric material, such as $SiO_2$, $Al_2O_3$, $HfO_2$, and SiON. Aspects of the gate dielectric 530b may be similarly described with respect to the gate dielectric 530a in the bottom gate TFT 500a of FIG. 5A.

Like the passivation layer 570a in the bottom gate TFT 500a of FIG. 5A, the gate dielectric 530b may be exposed to IR laser radiation 525 to heat the gate dielectric 530b according to some implementations. The gate dielectric 530b may substantially absorb the IR laser radiation 525 and permit heat transfer to the underlying the oxide semiconductor layer 540b. Defects in the oxide semiconductor layer 540b may be annealed out or otherwise passivated in the back channel interface and the bulk layer of the oxide semiconductor layer 540b. The gate dielectric 530a may further protect the oxide semiconductor layer 540b from the surrounding atmosphere and reduce the diffusion of oxygen across the back channel interface. The gate dielectric 530b may absorb the IR laser radiation 525 to treat the oxide semiconductor layer 540b prior to the formation of a top gate metal (not shown).

In some implementations, the substrate 510b may be exposed to the IR laser radiation 525 to transfer heat from the substrate 510b to the overlying oxide semiconductor layer 540b. As a result, defects in the front channel interface and bulk channel may be annealed or passivated. The substrate 510b may include any appropriate dielectric oxide material (e.g., $SiO_2$) to substantially absorb the IR laser radiation 525. In some implementations, the substrate 510b may absorb the IR laser radiation 525 irrespective of whether the top gate metal has already been formed.

Figure 5C:
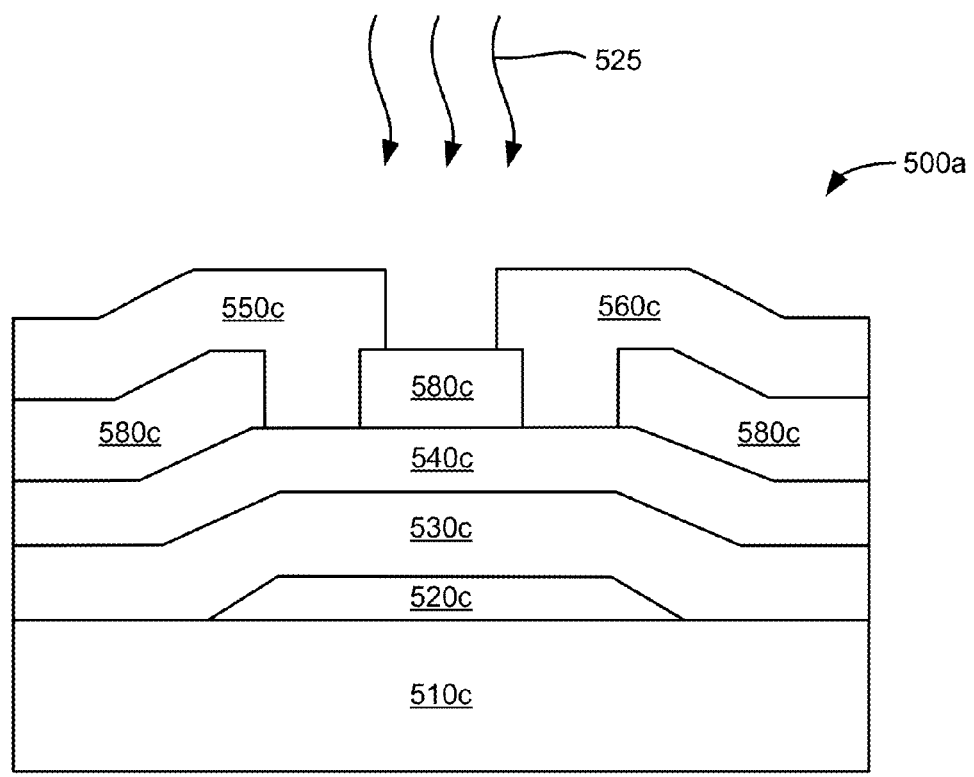
FIG. 5C is an example of a cross-sectional schematic diagram illustrating a partially fabricated bottom gate TFT with an etch stop layer exposed to laser radiation according to some implementations.

Regardless of TFT geometry, annealing an oxide semiconductor may be achieved with an etch stop layer in contact with the oxide semiconductor layer. FIG. 5C is an example of a cross-sectional schematic diagram illustrating a partially fabricated bottom gate TFT with an etch stop layer exposed to laser radiation according to some implementations. The partially fabricated bottom gate TFT 500c can include a substrate 510c, a gate metal 520c over the substrate 510c, a gate dielectric 530c over the gate metal 520c, and an oxide semiconductor layer 540c over the gate dielectric 530c. Aspects of the substrate 510c, the gate metal 520c, the gate dielectric 530c, and the oxide semiconductor layer 540c may be similarly described with reference to the substrate 510a, the gate metal 520a, the gate dielectric 530a, and the oxide semiconductor layer 540a in the bottom gate TFT 500a of FIG. 5A.

An etch stop layer 580c may be formed over the oxide semiconductor layer 540c to protect the oxide semiconductor layer 540c from being etched by a dry (e.g., plasma) etching process or a wet chemical etching process. When a source metal 550c and a drain metal 560c are deposited over the etch stop layer 580c, the source metal 550c and the drain metal 560c may be etched to form a source terminal and a drain terminal, respectively. The source metal 550c may contact a source region of the oxide semiconductor layer 540c, and the drain metal 560c may contact a drain region of the oxide semiconductor layer 540c. The etch stop layer 580c may include any number of different dielectric materials, including $SiO_2$, $Al_2O_3$, $HfO_2$, and SiON. In some implementations, the etch stop layer 580c may include two or more layers of dielectric materials arranged in a stacked structure. In some implementations, a thickness of the etch stop layer 580c can be between about 100 nm and about 1000 nm, such as between about 300 nm and about 500 nm.

In manufacturing the partially fabricated bottom gate TFT 500c in FIG. 5C, the etch stop layer 580c may be formed on the oxide semiconductor layer 540c using any number of deposition, masking, and/or etching steps. The etch stop layer 580c may be deposited using deposition processes as known by a person having ordinary skill in the art, including PVD processes, CVD processes including PECVD processes, and ALD processes. For example, the etch stop layer 580c can include $SiO_2$ deposited using a PECVD process at a processing temperature less than about 250° C. Using a processing temperature of less than about 250° C. can reduce the likelihood of degradation of the underlying oxide semiconductor layer 540c. Moreover, forming the etch stop layer 580c may include etching portions of the etch stop layer 580c to expose certain regions of the oxide semiconductor layer 540c so that source/drain contacts may be provided. In some implementations, forming the etch stop layer 580c may introduce undesirable defects into the oxide semiconductor layer 540c.

The etch stop layer 580c may be heated by IR laser radiation 525 to anneal the oxide semiconductor layer 540c. The etch stop layer 580c may substantially absorb the IR laser radiation 525 and permit heat transfer to the underlying oxide semiconductor layer 540c. Defects in the oxide semiconductor layer 540c may be annealed out or otherwise passivated in the back channel interface and the bulk layer of the oxide semiconductor layer 540c. The defect density may decrease at the back channel interface and the density of the oxide semiconductor layer 540c may increase. The etch stop layer 580c may further protect the oxide semiconductor layer 540c from the surrounding atmosphere and limit the diffusion of oxygen. In some implementations, the etch stop layer 580c may be irradiated prior to the formation of the source metal 550c and the drain metal 560c. In other implementations, the etch stop layer 580c may be irradiated after the formation of the source metal 550c and the drain metal 560c. In some implementations, the partially fabricated bottom gate TFT 500c may further include a passivation layer (not shown) over the source metal 550c and the drain metal 560c.

Figure 7:
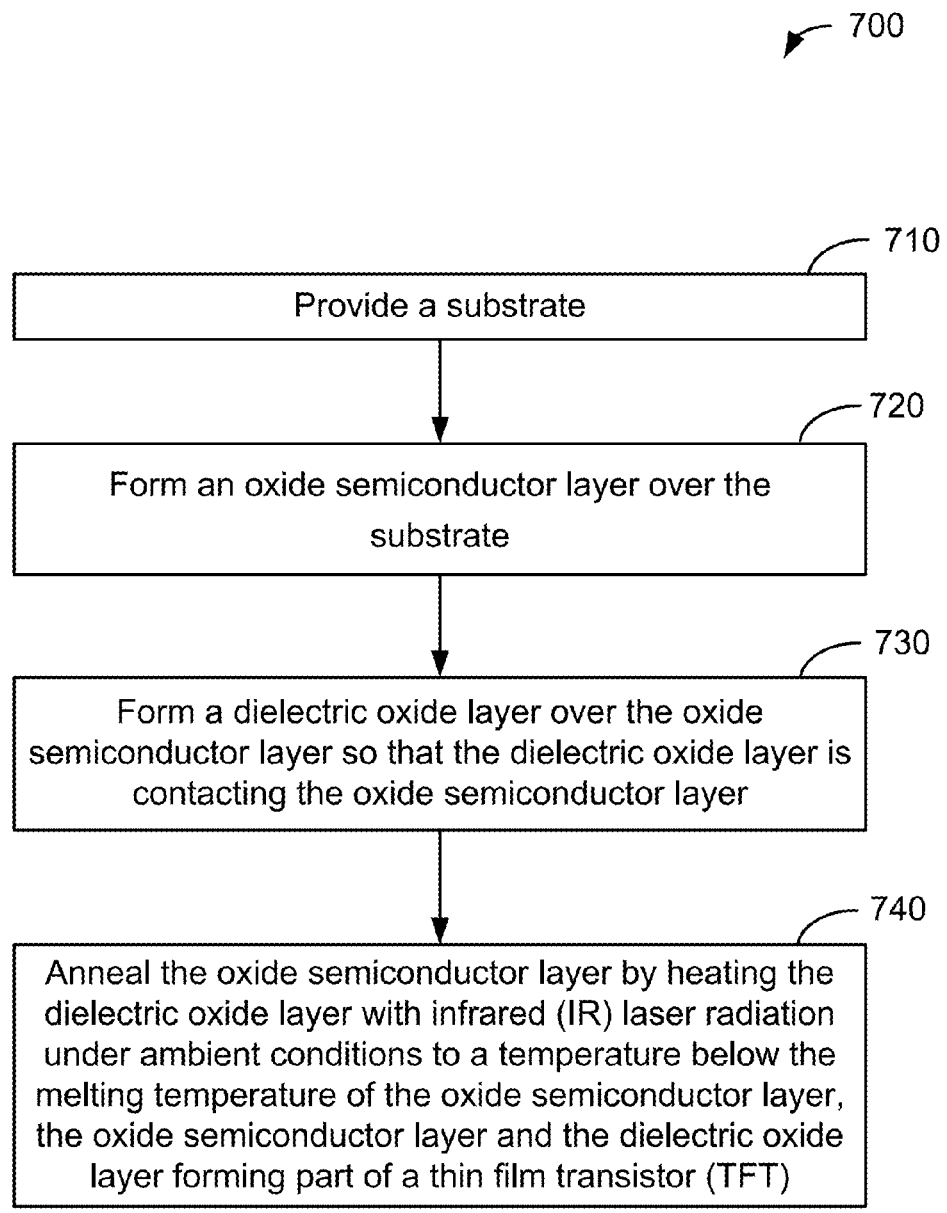
FIG. 7 is a flow diagram illustrating an example method of annealing an oxide semiconductor layer in a TFT according to some implementations.

FIG. 7 is a flow diagram illustrating an example method of annealing an oxide semiconductor layer in a TFT according to some implementations. The process 700 may be performed in different orders and/or with different, fewer or additional operations. In some implementations, the process 700 may be described with reference to one or more processing chambers and a controller, where the controller may be programmed to control any operations described herein.

At block 710 of the process 700, a substrate is provided. The substrate can include any substrate material, such as glass or plastic. At block 720 of the process 700, an oxide semiconductor layer is formed over the substrate. In some implementations, the oxide semiconductor layer can be amorphous and can include any suitable semiconducting metal oxide material, such as InGaZnO. The oxide semiconductor layer can include a channel region aligned with a gate metal, where the channel region is between a source region and a drain region of the oxide semiconductor layer. In some implementations, the oxide semiconductor layer can be between about 10 nm and about 100 nm thick.

At block 730 of the process 700, a dielectric oxide layer is formed over the oxide semiconductor layer so that the dielectric oxide layer is contacting the oxide semiconductor layer. The dielectric oxide layer may be one of a passivation layer, a gate dielectric layer, and an etch stop layer as described earlier herein. The dielectric oxide layer can include any suitable dielectric oxide material, such as $SiO_2$ or $Al_2O_3$. In some implementations, the material of the dielectric oxide layer may be selected to have an absorption coefficient of equal to or greater than about 2.0 $\mu m^{-1}$. In some implementations, the dielectric oxide layer can be between about 100 nm and about 1000 nm thick, such as between about 300 nm and about 500 nm thick. The oxide semiconductor layer and the dielectric oxide layer can form part of a TFT.

In some implementations, the process 700 further includes forming a source metal on the source region of the oxide semiconductor layer and forming a drain metal on the drain region of the oxide semiconductor layer. To form the source metal and the drain metal, the source metal and the drain metal may be etched. Thus, the process 700 may further include etching the source metal and the drain metal to expose the channel region of the oxide semiconductor layer. The etching of the source metal and the drain metal may occur before annealing the oxide semiconductor layer. In some implementations, forming the dielectric oxide layer occurs before forming the source metal and the drain metal. This can include instances where the dielectric oxide layer is an etch stop layer or a gate dielectric. In some implementations, forming the dielectric oxide layer can occur after forming the source metal and the drain metal. This can include instances where the dielectric oxide layer is a passivation layer formed over the source metal and the drain metal to protect the TFT.

In some implementations, the process 700 further includes forming a gate metal over the substrate. When the oxide semiconductor layer is annealed, the temperature of the annealing may be below the melting temperature of the gate metal, the source metal, and the drain metal. In some implementations, the gate metal may be formed on the substrate, and a gate dielectric may be formed on the gate metal for a bottom gate TFT. In some implementations, the dielectric oxide layer may serve as the gate dielectric, and the gate metal may be formed over the gate dielectric for a top gate TFT.

The substrate, with both the oxide semiconductor layer and the dielectric oxide layer formed on the substrate, may be provided in a processing chamber. The substrate may be supported on a pedestal or other substrate support in the processing chamber. In some implementations, the substrate may be transferred into the processing chamber from another station or chamber. A laser source may be positioned inside or outside the processing chamber and configured to expose the dielectric oxide layer to laser radiation. The laser source may be a $CO_2$ laser configured to emit IR laser radiation.

A controller may be connected to the laser source to control the operations of the laser source. The controller may contain one or more memory devices and one or more processors. Instructions for implementing appropriate control operations may be executed on the one or more processors. In some implementations, the controller may execute instructions for controlling various laser parameters, such as output power, pulse energy, pulse duration, beam diameter, beam intensity, divergence, beam quality, brightness, and exposure time. In some implementations, the controller may also execute instructions for controlling other parameters associated with the substrate support and the processing chamber. The controller may also execute instructions for monitoring, maintaining, and/or adjusting certain process variables.

At block 740 of the process 700, the oxide semiconductor layer is annealed by heating the dielectric oxide layer with IR laser radiation to a temperature below the melting temperature of the oxide semiconductor layer. The annealing may be performed under ambient conditions. The ambient conditions may provide a source of oxygen for passivating defects during annealing. An IR laser source may emit the IR laser radiation to heat the dielectric oxide layer, where the dielectric oxide layer substantially absorbs the IR laser radiation. Laser parameters such as output power may be controlled so that the dielectric oxide layer is heated to a temperature below the melting temperature of the oxide semiconductor layer, such as between about 200° C. and about 500° C. The dielectric oxide layer may be heated to a temperature less than the melting temperature of other surrounding layers, including the substrate, the gate metal, the source metal, the drain metal, and other components of the TFT. Accordingly, the oxide semiconductor layer may be annealed without inadvertently melting the oxide semiconductor layer or other surrounding materials. In some implementations, the exposure time for annealing the oxide semiconductor layer may be less than the thermal response of the multilayer TFT structure or the substrate. For example, depending on the peak power of the laser source, the exposure time can be on the order of microseconds or less, such as between about 1 nanosecond and about 1 microsecond. Additionally, the dielectric oxide layer is exposed to the IR laser radiation under atmospheric conditions. Any vulnerability the oxide semiconductor layer may have to atmospheric conditions may be mitigated by the dielectric oxide layer.

Figure 8A:
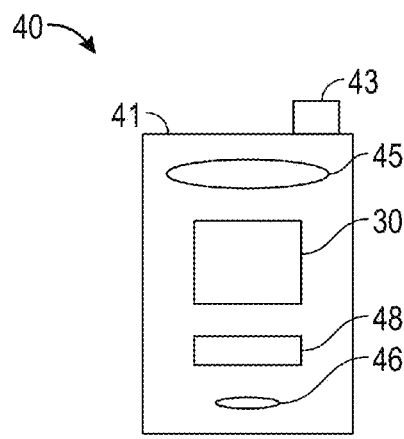
FIGS. 8A and 8B are system block diagrams illustrating a display device that includes a plurality of IMOD display elements.
Figure 8B:
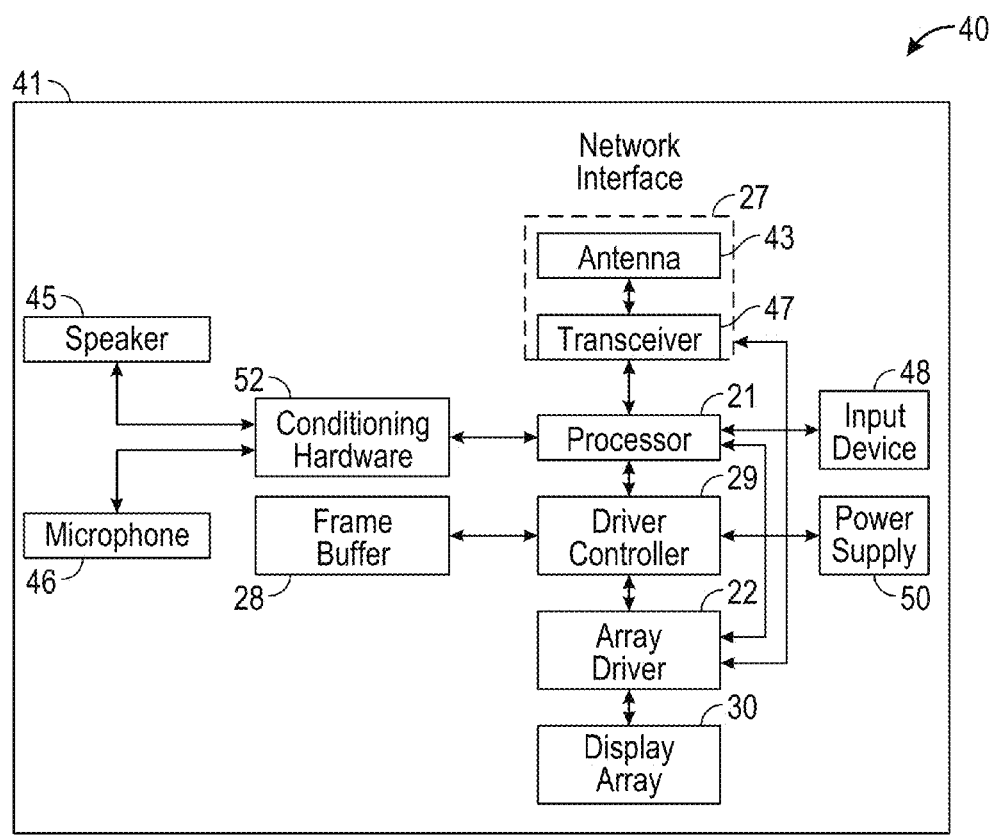

FIGS. 8A and 8B are system block diagrams illustrating a display device 40 that includes a plurality of IMOD display elements and the TFT as described herein. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 8A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 8A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A method to make a thin film transistor (TFT), the method comprising:
    providing a substrate;
    forming an oxide semiconductor layer over the substrate;
    forming a dielectric oxide layer over the oxide semiconductor layer so that the dielectric oxide layer is contacting the oxide semiconductor layer; and
    annealing without crystallizing the oxide semiconductor layer by heating the dielectric oxide layer with an infrared (IR) laser radiation under ambient conditions to a temperature below a melting temperature of the oxide semiconductor layer, the oxide semiconductor layer and the dielectric oxide layer forming part of the TFT, wherein a wavelength of the IR laser radiation corresponds to a thickness and a composition of the dielectric oxide layer so that the dielectric oxide layer substantially absorbs the IR laser radiation during annealing.

2. The method of claim 1, wherein the wavelength of the IR laser radiation is selected to correspond to the composition and thickness of the dielectric oxide layer to absorb at least 70% of the IR laser radiation.

3. The method of claim 1, wherein the thickness of the dielectric oxide layer is between about 100 nm and about 1000 nm.

4. The method of claim 1, wherein an absorption coefficient of the dielectric oxide layer is about equal to or greater than 2.0 $\mu m^{-1}$.

5. The method of claim 1, wherein the dielectric oxide layer includes at least one of $SiO_2$ and $Al_2O_3$.

6. The method of claim 1, wherein the temperature for annealing is between about 200° C. and about 500° C.

7. The method of claim 1, further comprising:
    forming a source metal on a source region of the oxide semiconductor layer; and
    forming a drain metal on a drain region of the oxide semiconductor layer, wherein a channel region of the oxide semiconductor layer is defined between the source region and the drain region.

8. The method of claim 7, further comprising:
    etching the source metal and the drain metal to expose the channel region of the oxide semiconductor layer, wherein annealing the oxide semiconductor layer occurs after etching the source metal and the drain metal.

9. The method of claim 8, wherein the dielectric oxide layer is a passivation layer, the passivation layer being formed after the etching the source metal and the drain metal.

10. The method of claim 8, wherein the dielectric oxide is an etch stop layer, the etch stop layer being formed before etching the source metal and the drain metal.

11. The method of claim 8, wherein the dielectric oxide layer includes a gate dielectric, the gate dielectric being formed before etching the source metal and the drain metal.

12. The method of claim 7, further comprising:
    forming a gate metal over the substrate, wherein the temperature for annealing is below a melting temperature of the source metal, the drain metal, and the gate metal.

13. The method of claim 1, wherein the oxide semiconductor layer includes InGaZnO.

14. The method of claim 1, wherein the IR laser radiation is emitted from a carbon dioxide ($CO_2$) laser.

15. The method of claim 1, wherein annealing the oxide semiconductor layer by heating the dielectric oxide layer increases a density of the oxide semiconductor layer without crystallizing the oxide semiconductor layer.

16. The method of claim 1, wherein annealing the oxide semiconductor layer by heating the dielectric oxide layer reduces a defect density in the oxide semiconductor layer without crystallizing the oxide semiconductor layer.

17. The method of claim 1, wherein annealing the oxide semiconductor layer is localized at a back channel interface of the oxide semiconductor layer, the back channel interface contacting the dielectric oxide layer.

18. A method to make a thin film transistor (TFT), the method comprising:
    providing a substrate;
    forming an oxide semiconductor layer over the substrate;
    forming a source metal on a source region of the oxide semiconductor layer; and
    forming a drain metal on a drain region of the oxide semiconductor layer, wherein a channel region of the oxide semiconductor layer is defined between the source region and the drain region;
    etching the source metal and the drain metal to expose the channel region of the oxide semiconductor layer;
    forming a dielectric oxide layer over the oxide semiconductor layer so that the dielectric oxide layer is contacting the oxide semiconductor layer; and
    annealing without crystallizing the oxide semiconductor layer by heating the dielectric oxide layer with an infrared (IR) laser radiation under ambient conditions to a temperature below a melting temperature of the oxide semiconductor layer, the oxide semiconductor layer and the dielectric oxide layer forming part of the TFT, wherein annealing the oxide semiconductor layer occurs after etching the source metal and the drain metal.

19. The method of claim 18, wherein the dielectric oxide layer is a passivation layer, the passivation layer being formed after the etching the source metal and the drain metal.

20. The method of claim 18, wherein the dielectric oxide layer is an etch stop layer, the etch stop layer being formed before etching the source metal and the drain metal.

21. The method of claim 18, wherein the dielectric oxide layer includes a gate dielectric, the gate dielectric being formed before etching the source metal and the drain metal.

* * * * *